United States Patent
Wei

(10) Patent No.: US 6,722,423 B1
(45) Date of Patent: Apr. 20, 2004

(54) HEAT SINK

(76) Inventor: Wen-Chen Wei, P.O. Box No. 6-57, Chung-Ho City, Taipei Hsien 235 (TW)

( * ) Notice: Subject to any disclaimer, the term of this patent is extended or adjusted under 35 U.S.C. 154(b) by 0 days.

(21) Appl. No.: 09/659,330

(22) Filed: Sep. 12, 2000

(51) Int. Cl.[7] .................................................. F28F 7/00
(52) U.S. Cl. ...................... 165/185; 165/80.3; 257/722; 257/721; 361/704; 361/690; 361/697
(58) Field of Search ................. 165/80.3, 185; 174/16.3; 257/718, 719, 722, 721; 361/697, 690, 702, 703, 704, 709, 710

(56) References Cited

U.S. PATENT DOCUMENTS

| | | | | |
|---|---|---|---|---|
| 3,893,161 A | * | 7/1975 | Pesak, Jr. ................ | 165/185 X |
| 4,041,524 A | * | 8/1977 | Trunk et al. ............. | 165/185 X |
| 4,235,285 A | * | 11/1980 | Johnson et al. .......... | 257/718 X |
| 4,388,967 A | * | 6/1983 | Breese .................... | 257/719 X |
| 4,605,058 A | * | 8/1986 | Wilens .................... | 165/185 X |
| 4,869,068 A | * | 9/1989 | Van Vroten ............. | 165/185 X |
| 4,872,505 A | * | 10/1989 | Jones et al. ............. | 165/185 X |
| 5,422,790 A | * | 6/1995 | Chen ....................... | 257/719 X |
| 5,504,652 A | * | 4/1996 | Foster et al. ............. | 257/719 X |
| 5,901,781 A | * | 5/1999 | Arai et al. ............... | 165/185 X |
| 5,930,114 A | * | 7/1999 | Kuzman et al. ......... | 257/719 X |
| 5,991,154 A | * | 11/1999 | Clemons et al. ......... | 257/719 X |
| 6,088,228 A | * | 7/2000 | Petersen et al. ......... | 165/185 X |

FOREIGN PATENT DOCUMENTS

AU            227586    * 10/1958       ................ 165/185

* cited by examiner

Primary Examiner—Christopher Atkinson
(74) Attorney, Agent, or Firm—Troxell Law Office PLLC

(57) ABSTRACT

A highly efficient heat sink, comprised of a seat, a heat insulation plate, a heat conduction plate and heat dispersion plates. The heat insulation plate and the heat conduction plate are respectively extended from both ends of the seat, the heat insulation plates and heat conduction plate are each curved inward to form heat dispersion plates. An air conduction outlet is provided where the heat dispersion plate is respectively connected to the heat insulation plate and heat conduction plate, and an air vent is provided in the inner side to allow air circulation on each plane of the heat dispersion plate, the heat insulation plate and the conduction plate without heat accumulation inside the sink.

1 Claim, 3 Drawing Sheets

HEAT SINK

BACKGROUND OF THE INVENTION (a) Field of the Invention

The present invention relates to an improved structure of a heat sink, and more particularly, to one having air vent provided inside an air conduction outlet provided at where a heat dispersion plate and a heat insulation plate are respectively connected to a heat conduction plate so to allow good air circulation to disperse the heat and effectively lower the temperature.

(b) Description of the Prior Art

Whereas, to solve overheated computer device, a heat sink is installed to electronic heat emission device to conduct and disperse the heat generated by electronic device in the prior art as illustrated in FIG. 1. Wherein, it is essentially comprised of a seat (1), a heat insulation plate (2) and a multiple of heat dispersion plates (3). The seat (1) and the heat insulation plate (2) are used to absorb the heat source generated by the electronic device. The multiple of heat dispersion plates (3) provided on the side edge of the seat (1) are used to take over the thermal energy absorbed by the seat (1) and the heat insulation plate (2), and diffuse the heat over the plate. The spacing among the multiple of heat dispersion plates permits air circulation to achieve the purpose of heat dispersion. However, the thermal energy absorbed from electronic device by the heat insulation plate (1) has to rely on the conduction by the seat (1) before reaching the heat dispersion plates (3). Therefore, heat is slowly dispersed and not ideal for the electronic device that requires fast heat dispersion due to use for a longer time. In addition, the heat absorbed by the heat insulation plate (2) fails to be effectively dispersed, thus to damage the electronic device. As illustrated in FIG. 2, an improved structure of sink essentially comprised of a seat (4), a heat insulation plate (5), a heat conduction plate (6) and a heat dispersion plate (7) is available in the market. Wherein, a heat insulation plate (5) and a heat conduction plate (6) are respectively extended from both ends of the seat (4), and are bent inwardly to form heat dispersion plates (7). Since both heat dispersion plates are respectively connected to the heat insulation plate (5) and the heat conduction plate (6), thermal energy from electronic device absorbed by both of the seat (4) and the heat insulation plate (5) is rapidly conducted to the heat dispersion plates (7). Furthermore, the heat is dispersed through air circulation occurring between said heat dispersion plates (7). However, said improvement though has solved the problem of poor heat dispersion result due to inconsistent heat dispersion of the prior art of heat sink, it fails to effectively improve the function of the heat sink. The bending where the heat dispersion plate (7) is respectively connected to the heat insulation plate (5) and the heat dispersion plate (7) relies entirely on the hollow space at both sides for air circulation, thus is vulnerable to accumulate and reside heat. Therefore said structure does not effectively improve heat dispersion.

SUMMARY OF THE INVENTION

The primary purpose of the present invention is to provide a heat sink essentially comprised of seat, heat insulation plate, heat conduction plate and heat dispersion plate, within, both heat insulation and conduction plates are each folded inwardly to form heat dispersion plate, air conduction outlet is provided at where the heat dispersion plate respectively connects the heat insulation and conduction plates, and air vent is provided inside the air conduction outlet to ensure air circulation on all planes among heat dispersion, conduction and insulation plates for fast heat dispersion effect without accumulating any thermal energy.

Another purpose of the present invention is to provide a heat sink that allows rapid conduction of the thermal energy absorbed by the seat and heat insulation dispersion plate (7) is available in the market. Wherein, a heat insulation plate (5) and a heat conduction plate (6) are respectively extended from both ends of the seat (4), and are bent inwardly to form heat dispersion plates (7). Since both heat dispersion plates are respectively connected to the heat insulation plate (5) and the heat conduction plate (6), thermal energy from electronic device absorbed by both of the seat (4) and the heat insulation plate (5) is rapidly conducted to the heat dispersion plates (7). Furthermore, the heat is dispersed through air circulation occurring between said heat dispersion plates (7). However, said improvement though has solved the problem of poor heat dispersion result due to inconsistent heat dispersion of the prior art of heat sink, it fails to effectively improve the function of the heat sink. The bending where the heat dispersion plate (7) is respectively connected to the heat insulation plate (5) and the heat dispersion plate (7) relies entirely on the hollow space at both sides for air circulation, thus is vulnerable to accumulate and reside heat. Therefore said structure does not effectively improve heat dispersion.

DETAILED DESCRIPTION OF THE PREFERRED EMBODIMENTS

Figure 1:
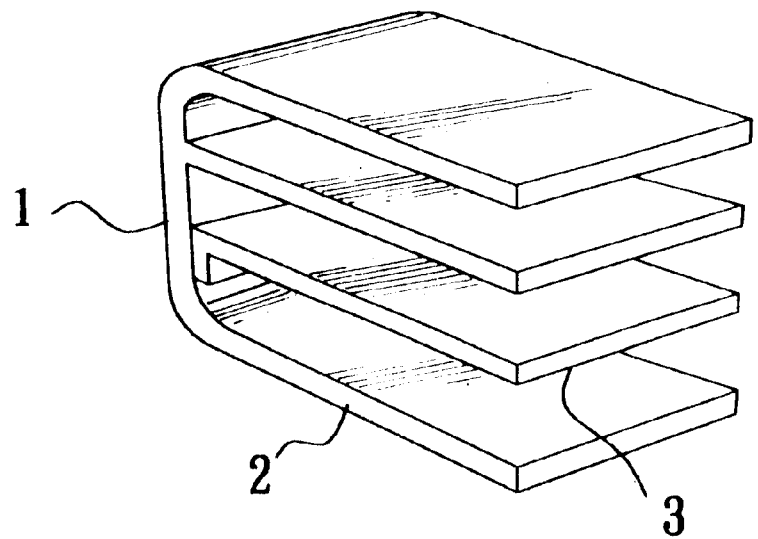
FIG. 1 is a schematic view showing the structure of the prior art of a heat sink.
Figure 2:
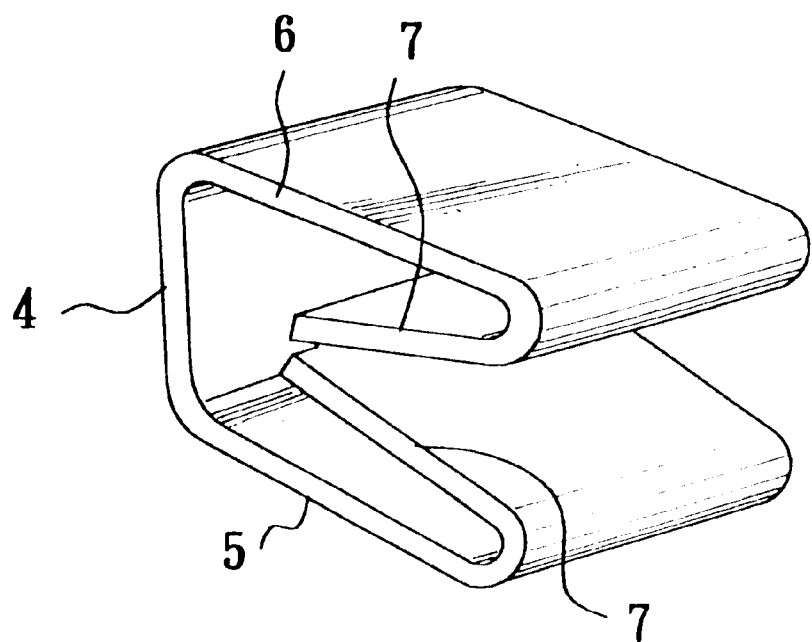
FIG. 2 is a schematic view showing another structure of the prior art of a heat sink.
Figure 3:
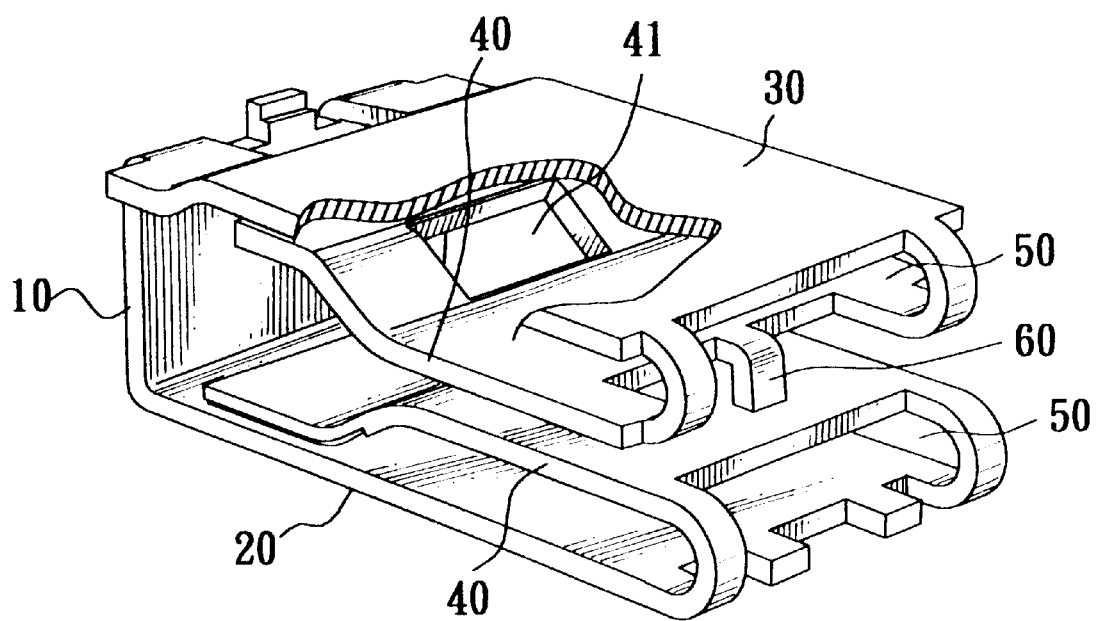
FIG. 3 is a schematic view showing the structure of the present invention.
Figure 4:
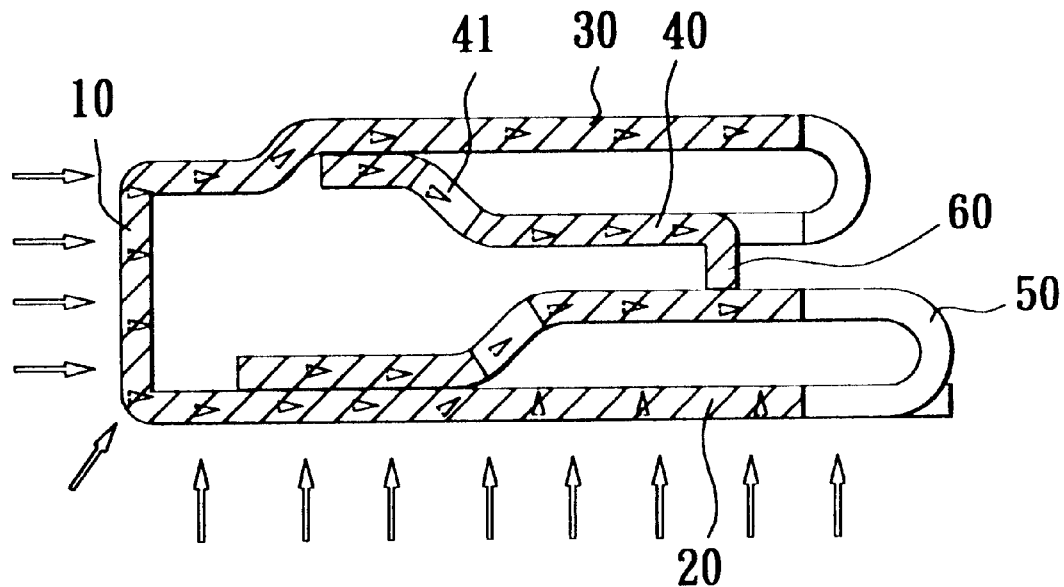
FIG. 4 is a schematic view showing the conduction of thermal energy occurring in the present invention.

As illustrated in FIG. 3, the present invention is essentially comprised of a seat (10), a heat insulation plate (20), a heat conduction plate (30) and a heat dispersion plate (40). Wherein, the heat insulation plate (20) and the heat conduction plate (30) are respectively extended from both ends of the seat (10), and each are folded inwardly to form the heat dispersion plates (40). Said heat dispersion plates are respectively provided with an air conduction outlet (50) and with an air vent (41) on its inner side at where it is connected to the heat insulation plate (20) and the heat conduction plate (30). An air vent (41) is provided on the inner side of the air conduction outlet (50) while the end of the air conduction outlet respectively connects the inner side of the heat insulation plate (20) and the heat conduction plate (30).

Now referring to FIG. 3, thermal energy emitted from an electronic device is absorbed by the seat (10) and the heat insulation plate (20), then conducted to the heat dispersion plates (40) through the heat insulation plate (20) and the heat conduction plate (30). Since the ends of the heat dispersion plates (40) are respectively connected to the inner side of the heat insulation plate (20) and the heat conduction plate (30), the thermal energy is conducted not only through the folded part of the heat insulation plate (20) and the heat conduction plate (30) respectively connected to the heat dispersion plates (40), but also through the connection of the ends of the heat dispersion plates (40) respectively to the heat insulation plate (20) and the heat conduction plate (30). Therefore, the thermal energy absorbed from the electronic device by both of the seat (10) and the heat insulation plate (20) can be rapidly connected to the heat dispersion plates (40).

Figure 5:
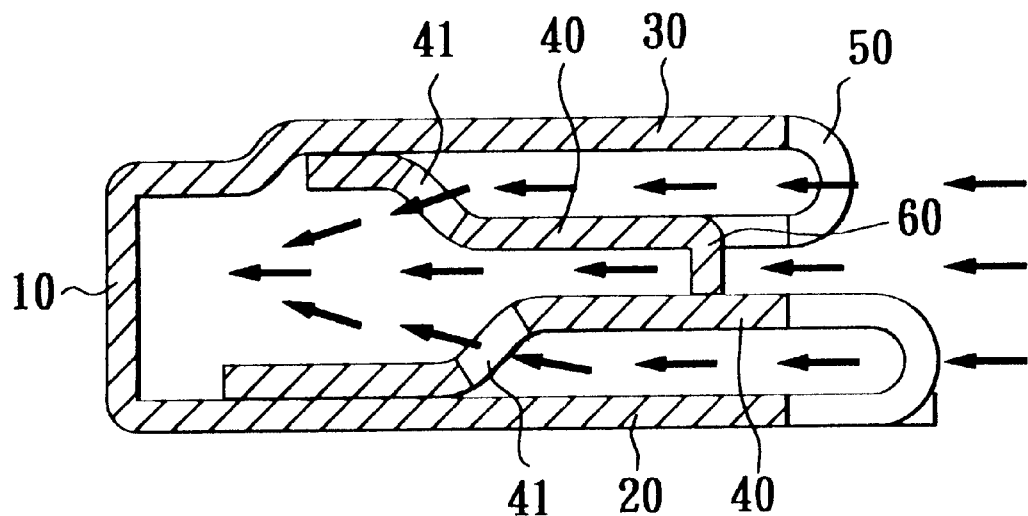
FIG. 5 is a schematic view showing the airflow occurring in the present invention.

In the air flow permitted by the present invention as illustrated in FIG. 5, the air is allowed to flow into a space created among the heat dispersion plate (40), the heat insulation plate (20) and the heat conduction plate (30) by means of the air conduction outlet (50) when the thermal energy is consistently transmitted and distributed on the heat dispersion plate (40), the heat insulation plate (20) and the heat conduction plate (30). The air then diffuses along both sides of the inner layers through the air vent (41). The air may also directly flow in through a space created between both heat dispersion plates (40) so that air circulates on each plane provided among the heat dispersion plate (40), the heat insulation plate (20) and the heat conduction plate (30) to eliminate possible accumulation of thermal energy inside the heat sink while the thermal energy on the heat dispersion plate (40), the heat insulation plate (20) and the heat conduction plate (30) can be rapidly and continuously dispersed to achieve good heat dispersion result.

Furthermore, as illustrated in FIG. 3, a stopper (60) is provided at the end of the air conduction outlet (50) on the heat dispersion plate (40) to maintain a certain range of spacing between both heat dispersion plates, thus to maintain air circulation there. The present invention provides rapid and effective heat conduction and dispersion and eliminates those defects of poor heat conduction or accumulation of thermal energy as found in the prior art.

What is claimed is:

1. A heat sink for an electronic device comprising:
   a) a seat portion;
   b) a heat insulation plate extending outwardly from a first side edge of the seat portion;
   c) a heat conduction plate extending outwardly from a second side edge of the seat portion in the same direction as the heat insulation plate, the heat conduction plate being spaced apart from the heat insulation plate;
   d) a first heat dispersion plate connected to an end portion of the heat insulation plate by a first folded portion, the first heat dispersion plate located in a space between the spaced apart heat insulation plate and heat conduction plate, such that the first heat dispersion plate is spaced from the heat insulation plate except for a terminal end connected to an inner side of the heat insulation plate;
   e) a second heat dispersion plate connected to an end portion of the heat conduction plate by a second folded portion, the second heat dispersion plate located in the space between the spaced apart heat insulation plate and heat conduction plate such that the second heat dispersion plate is spaced from the first heat dispersion plate and from the heat conduction plate, except for a terminal end connected to an inner side of the heat conduction plate;
   f) a first air conduction outlet formed in the first folded portion;
   g) a first air vent through the first heat dispersion plate adjacent to the connection with the heat insulation plate;
   h) a second air conduction outlet formed in the second folded portion; and,
   i) a second air vent through the second heat dispersion plate adjacent to the connection with the heat conduction plate.

* * * * *